(12) United States Patent
Torii

(10) Patent No.: US 6,219,534 B1
(45) Date of Patent: Apr. 17, 2001

(54) RADIO COMMUNICATION APPARATUS

(75) Inventor: Kenichi Torii, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/247,082

(22) Filed: Feb. 9, 1999

(30) Foreign Application Priority Data

Feb. 9, 1998 (JP) .................................................. 10-027384

(51) Int. Cl.$^7$ ...................................................... H04B 1/10
(52) U.S. Cl. ............................ 455/303; 455/63; 375/349
(58) Field of Search .............................. 455/63, 296, 295, 455/302, 303, 67.1, 67.3, 226.1, 226.4, 501; 375/346, 348, 349

(56) References Cited

U.S. PATENT DOCUMENTS

| 5,396,656 | * | 3/1995 | Jasper et al. .......................... 455/303 |
| 5,410,750 | * | 4/1995 | Cantwell et al. ..................... 375/349 |
| 5,579,347 | * | 11/1996 | Lindquist et al. .................... 455/296 |
| 6,131,013 | * | 10/2000 | Bergstrom et al. .................... 455/63 |

* cited by examiner

Primary Examiner—Nay Maung
Assistant Examiner—Quochien B. Vuong
(74) Attorney, Agent, or Firm—Oblon, Spivak, McClelland, Maier & Neustadt, P.C.

(57) ABSTRACT

A radio communication apparatus comprises an analog I/Q signal generator, a digital demodulator, and an interference wave suppression control block. The interference wave suppression block detects a gain difference between an in-phase component and a double quadrature component, based on an input and output signals of a low pass filter in the digital demodulator and the output of the double quadrature mixer, and controls a reference voltage of an A/D converter in the digital demodulator. Therefore, it is possible to reduce the gain difference of the in-phase component and the quadrature component, and to effectively eliminate an interference wave mixed in a base band signal. Furthermore, a radio communication apparatus according to the present invention comprises an antenna input block, a reception block, a transmission block, and an in/out block. Because a frequency when sending data is equal to the frequency when receiving data, it is possible to quickly change transmission and reception. Accordingly, it is possible to effectively use time-slots and transfer data at high speed.

10 Claims, 16 Drawing Sheets

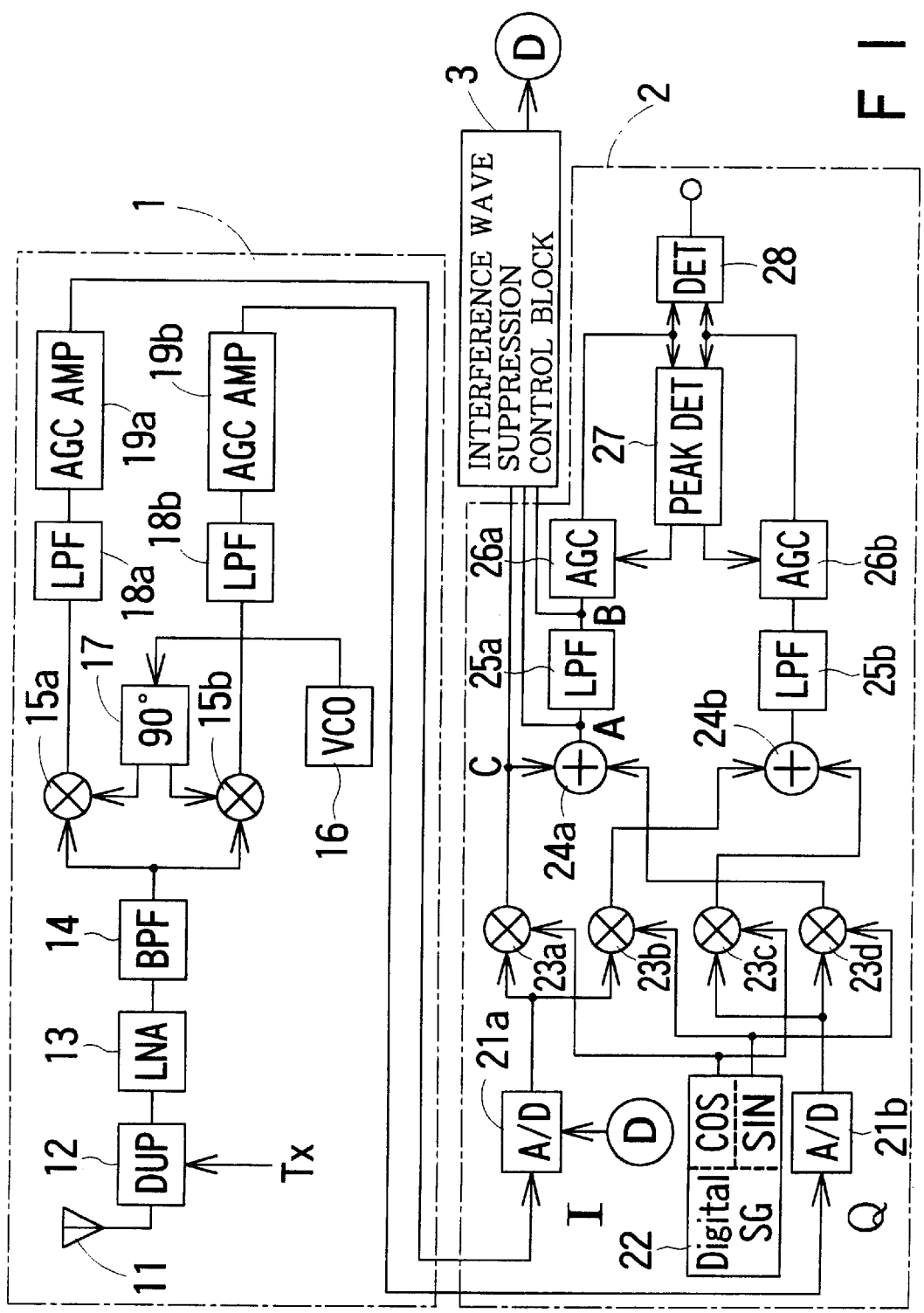
F I G. 1

OUTPUT OF QUADRATURE MIXER 15a
(INPHASE COMPONENT)

OUTPUT OF QUADRATURE MIXER 15b
(QUADRATURE COMPONENT)

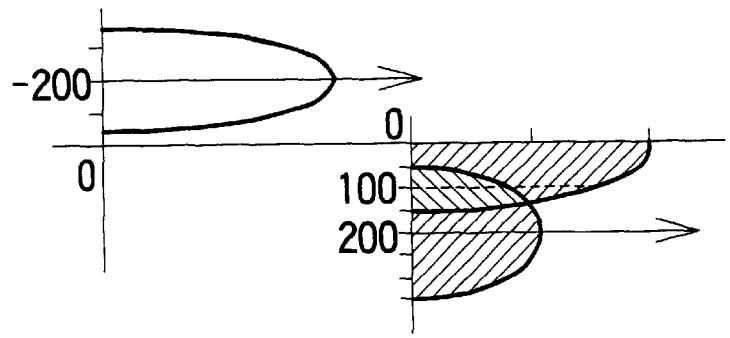
F I G. 5A
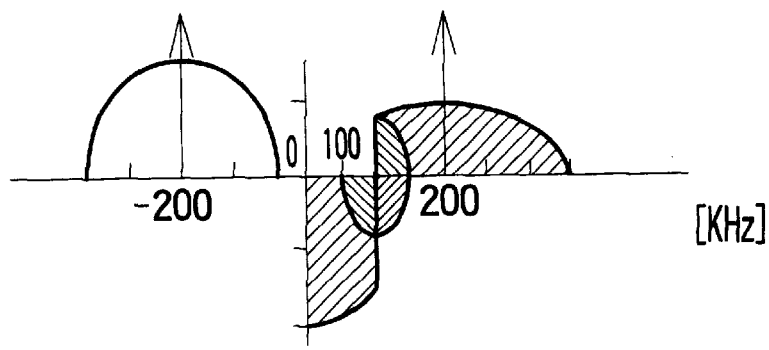
F I G. 5B
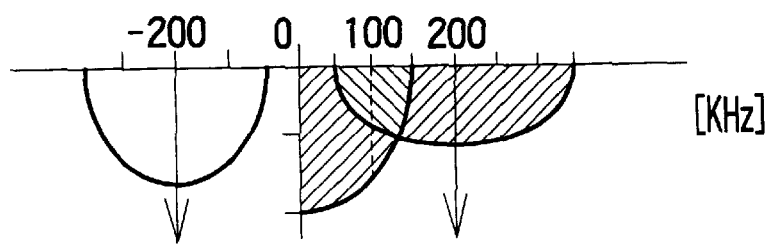
F I G. 5C
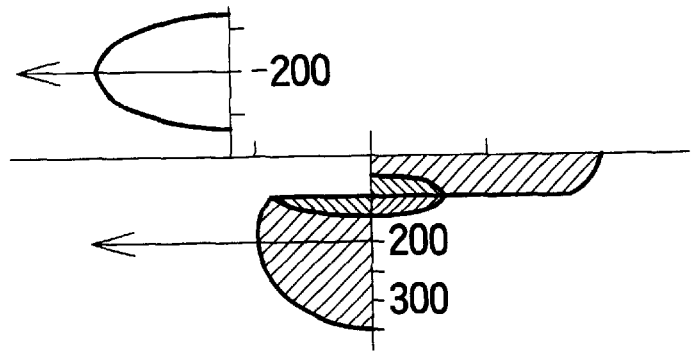
F I G. 5D

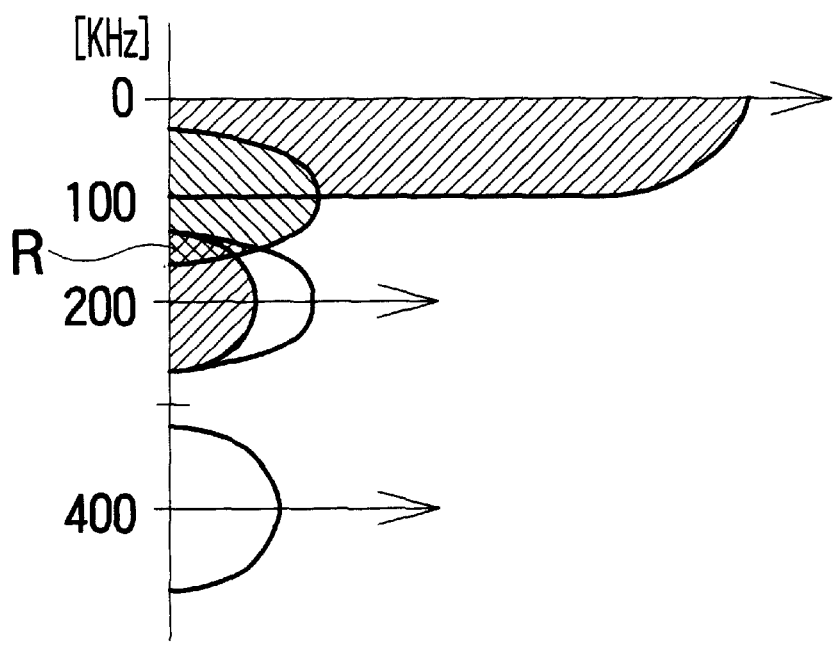
F I G. 6A
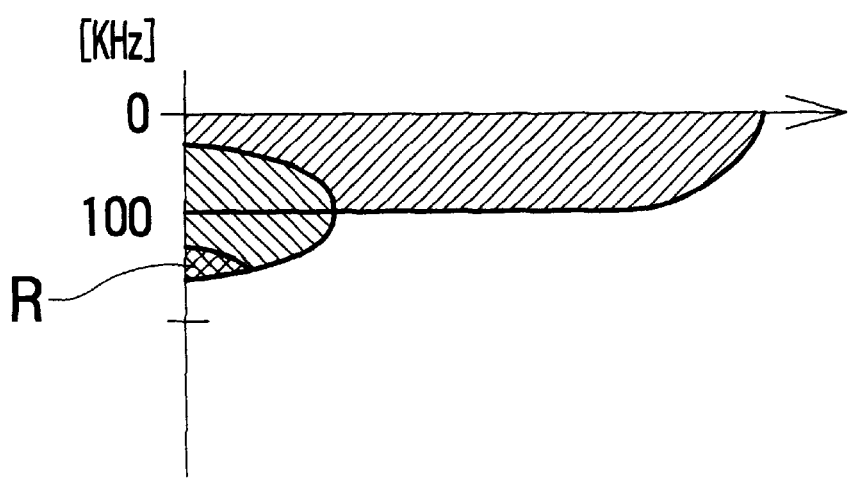
F I G. 6B

| COMPARATIVE RESULT OF LEVEL COMPARATOR | SIGN DETERMINATION OF SIGN CHANGER | DIGIT DETERMINATION OF I SIGNAL AND Q SIGNAL | REFERENCE VOLTAGE OF A/D CONVERTER | OUTPUT GAIN OF A/D CONVERTER |
|---|---|---|---|---|
| X>Y | + | I>Q | INCREASE | DECREASE |
| X<Y | − | I<Q | DECREASE | INCREASE |

FIG. 8

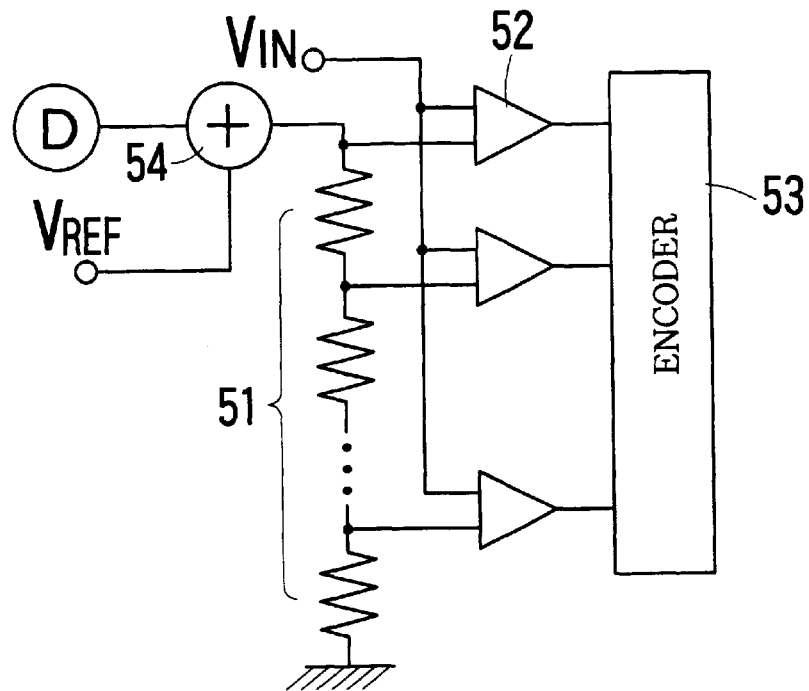
F I G. 9A
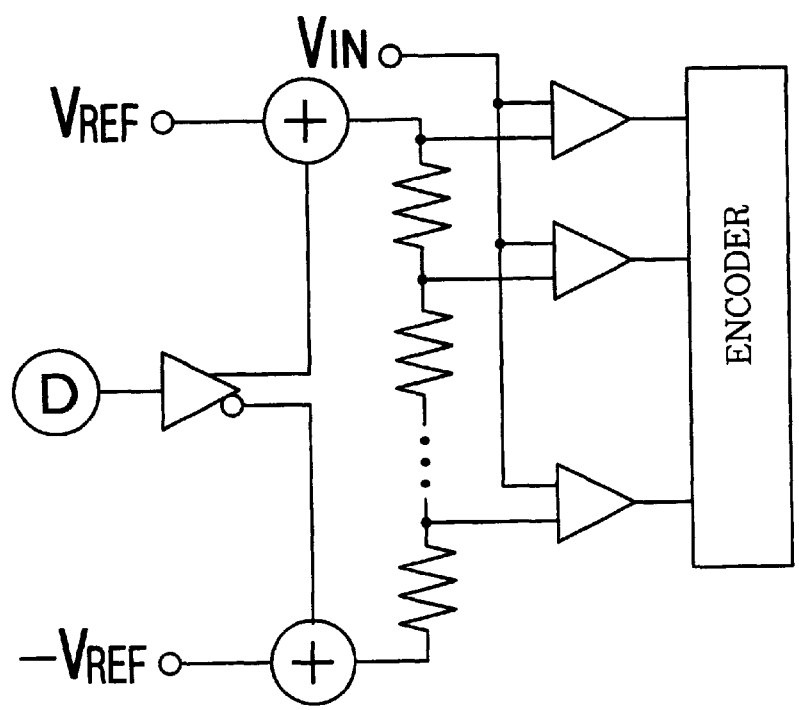
F I G. 9B

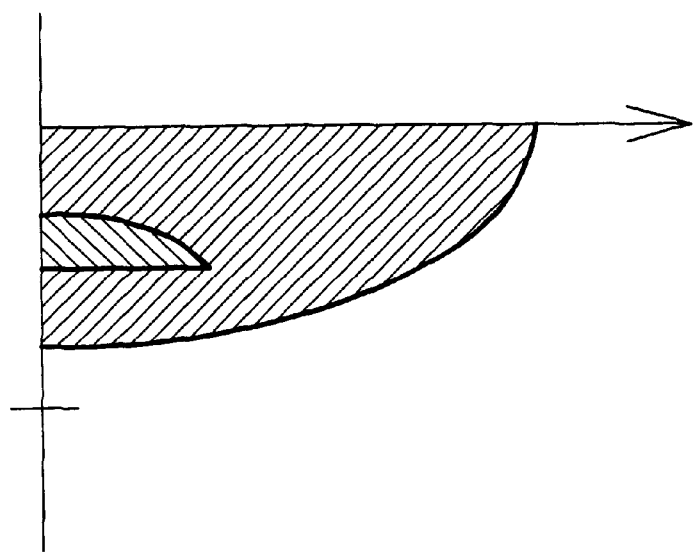
F I G. 10A
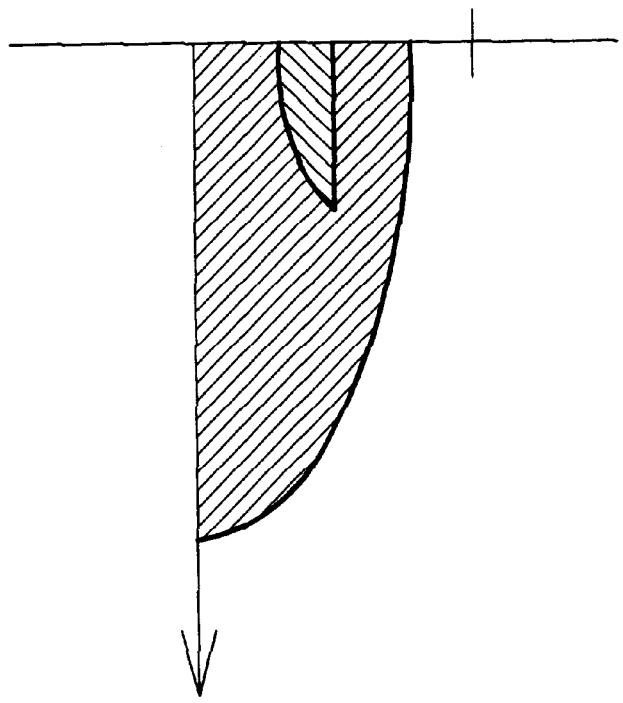
F I G. 10B

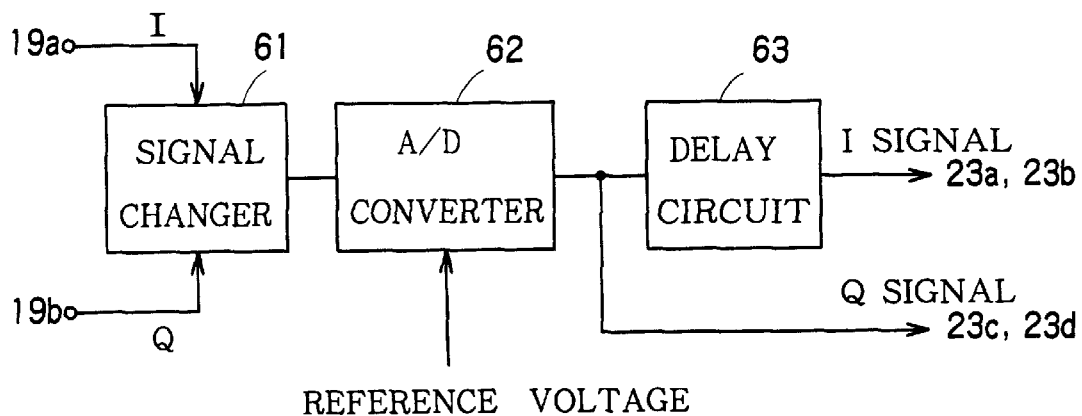
F I G. 11
| AIUR | TCH/F4.8 | TCH/F9.6 |
|---|---|---|
| 4.8kbit/s | 1 | N/A |
| 9.6kbit/s | 2 | 1 |
| 14.4kbit/s | 3 | N/A |
| 19.2kbit/s | 4 | 2 |
| 28.8kbit/s | N/A | 3 |
| 38.4kbit/s | N/A | 4 |
F I G. 12

GSM/DCS Dual Band Block for High-speed Data Transmission

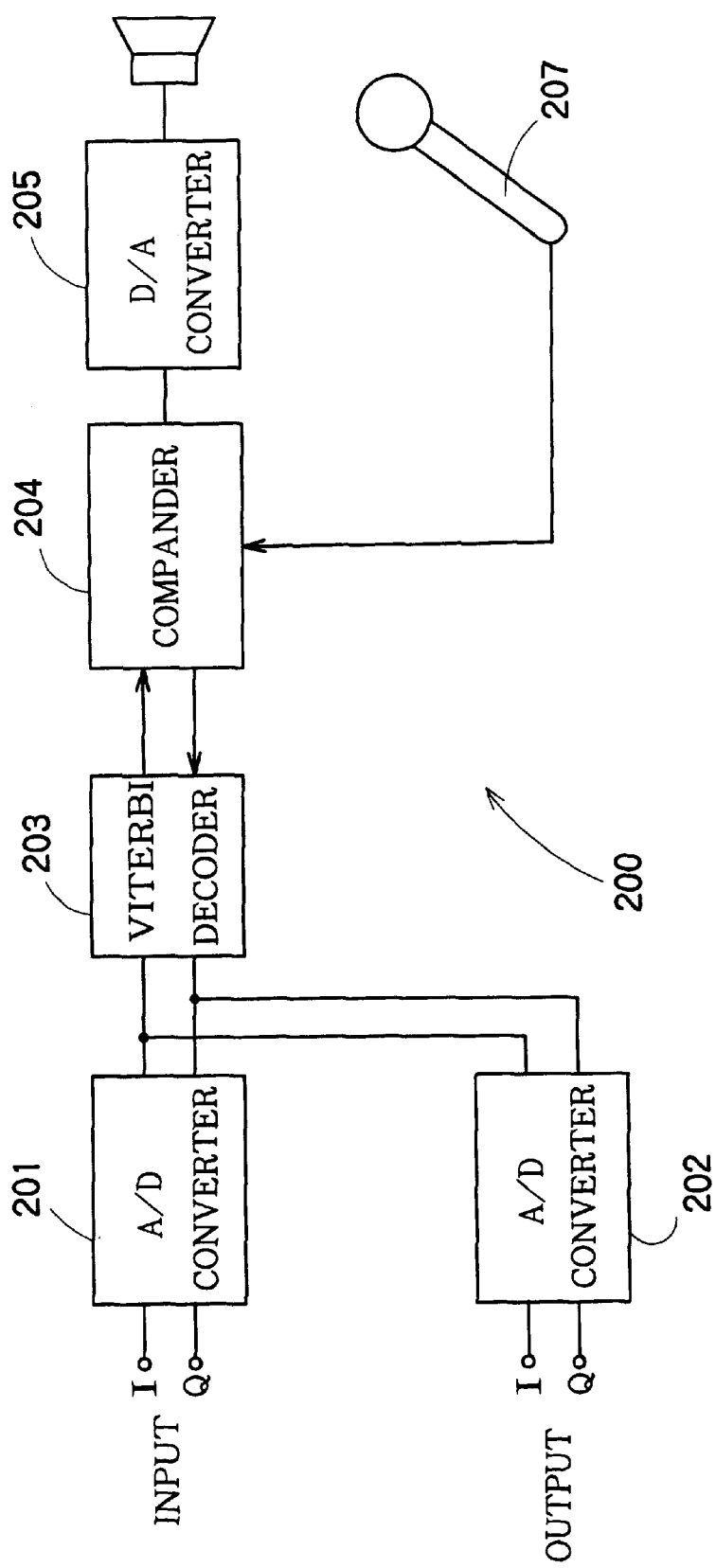
F I G. 15

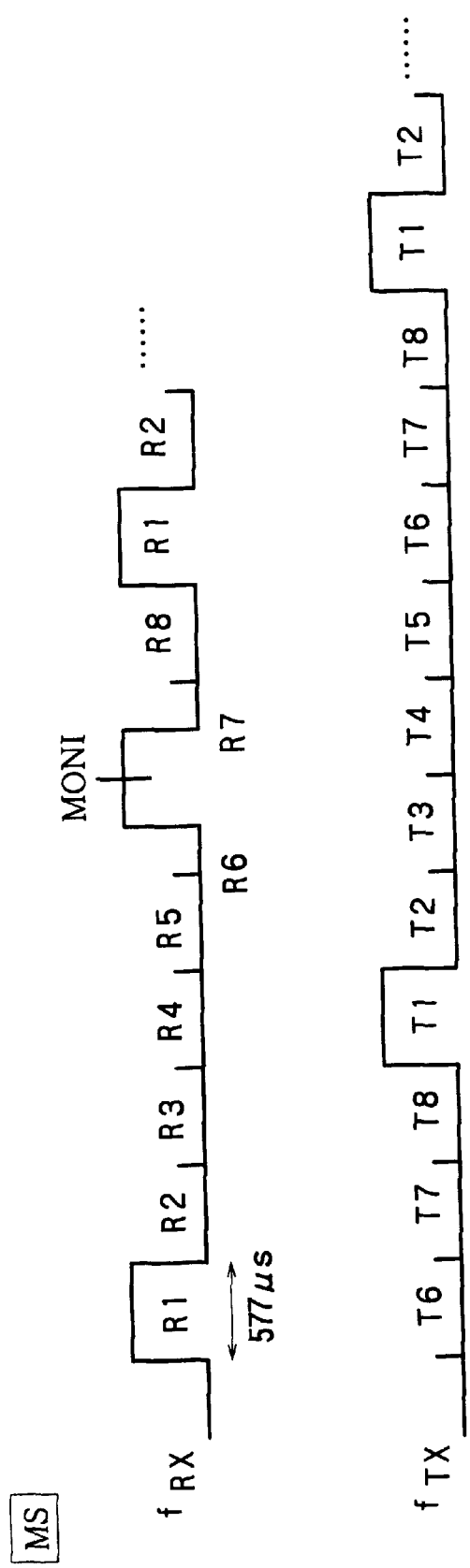
F I G. 17

RADIO COMMUNICATION APPARATUS

BACKGROUND OF THE INVENTION

1. Field of the Invention

The present invention relates to a radio communication apparatus used for a radio receiver such as a cellular phone. Especially, the present invention relates to a circuit system which suppresses an interference wave automatically and is able to transfer data at high speed.

2. Related Background Art

The cellular phone has prevailed rapidly. There are an analog system and a digital system for the cellular phone. The digital system can use frequency band more efficiently than the analog system, and the digital system surpasses the analog system in capability for security. Because of this, it is predicted that the digital system becomes predominant in future.

The digital system converts a voice signal into code information and transfers the information by radio frequency. Because of this, the digital system has a feature in that it hardly suffers the influence of noise. On the other hand, in order to increase the number of channels available for the cellular phone, frequency band per a channel has to be narrowed. However, when the frequency band per a channel is narrowed, each channel easily suffers the influence of the noise. Because of this, a conventional circuit which suppresses an image interference wave by using a quadrature mixer and a ±45° phase shifter has been known.

In order to suppress the image interference wave, it is necessary to control a gain difference and a phase difference between an I signal as an in-phase component and a Q signal as a quadrature component. However, the conventional circuit has initially set the gain difference and the phase difference only by hand. The reason is because differential signals of the gain difference and the phase difference is very little, for example, less than 1 dB or 2°, and because a technique which detects such a micro signal with high precision and controls the gain difference and the phase difference has not been established. Because of this, the gain difference and the phase difference had to be controlled by hand. Accordingly, it has taken a long time to control the gain difference and the phase difference, and the conventional circuit could not suppress the image interference wave at will.

On the other hand, FIG. 17 is a diagram which explains TDMA (time-division multiple access) in a mobile communication system called a GSM system which is prevailing in Europe. As shown in FIG. 17, the GSM system transfers data at each time-slot. A sending timing fRX of a mobile station (MS) which communicates with a base station and a receiving timing fTX is being shown in FIG. 17.

The mobile station receives the data at a time R1 and sends data at a time T1. The mobile station receives the next data at a time R2 after 8 time-slot of the time R1. Between times R6 and R7, a period which monitors another channel is provided.

The mobile station has to perform both of a voice communication and a data transfer within one time-slot. Because of this, the capability of transferring data is inevitably limited by a time length per one time-slot.

Accordingly, in order to transfer a large amount of data at high speed, a bit rate in a time-slot has to be raised, or data transfer has to be performed by using a plurality of slots. It is difficult to realize the former because of restriction of the conventional system. In the case of the latter, because an interval between the sending period and the receiving period becomes narrow inevitably, a frequency synthesizer used in the radio communication apparatus has to be changed quickly. That is, it is necessary to use an expensive frequency synthesizer.

SUMMARY OF THE INVENTION

An object of the present invention is to provide a radio communication apparatus which is able to suppress a interference wave by an automatic control.

Furthermore, an another object of the present invention is to provide a radio communication apparatus which is able to transfer data at high speed without using a frequency synthesizer capable of changing the frequency quickly.

In order to achieve the foregoing object, a radio communication apparatus, comprising:

a first in-phase/quadrature component separating circuit for separating a selecting frequency component included in a signal received by an antenna into an in-phase component signal and a quadrature component signal;

a first A/D converter for outputting a digital signal obtained through an A/D converter of the in-phase component signal separated by said first in-phase/quadrature component separating circuit;

a second A/D converter for outputting a digital signal obtained through an A/D conversion of the quadrature component signal separated by said first in-phase/quadrature component separating circuit;

a detecting circuit for performing a detecting process based on the digital signals outputted from said first and second A/D converters;

a second in-phase/quadrature component separating circuit for separating the digital signal outputted from said first A/D converter into the in-phase component signal and the quadrature component signal;

a third in-phase/quadrature component separating circuit for separating the digital signal outputted from said second A/D converter into the in-phase component signal and the quadrature component signal; and an interference wave suppression control circuit for controlling at least one of reference voltages of said first and second A/D converters based on each signal separated by said second and third in-phase/quadrature component separating circuits, so that the gain difference of each digital signal outputted from said first and second A/D converters is equal to or less than a prescribed value.

Furthermore, a radio communication apparatus, comprising:

a first in-phase/quadrature component separating circuit for separating a selecting frequency component included in a signal received by an antenna into an in-phase component signal and a quadrature component signal;

a signal selecting circuit for selecting either the in-phase component signal or the quadrature component signal separated by said first in-phase/quadrature component separating circuit;

an A/D converter for outputting a digital signal obtained through an A/D conversion of the signal selected by said signal selecting circuit;

a delay circuit for delaying the digital signal outputted from said A/D converter;

a second in-phase/quadrature component separating circuit for separating the output of said delay circuit into an in-phase component signal and the quadrature component signal;

a third in-phase/quadrature component separating circuit for separating the digital signal outputted from said A/D converter into an in-phase component signal and a quadrature component signal; and an interference wave suppression control circuit for controlling the reference voltage of said A/D converter based on each signal separated by said second and third in-phase/quadrature component separating circuits, so that a gain difference of each digital signal outputted from said A/D converter or said delay circuit is equal to or less than a prescribed value.

Furthermore, a radio communication apparatus for transmitting signals with two different frequency bands, comprising:

a first local oscillator for outputting a first local oscillating signal;

a frequency divider for dividing a frequency of said first local oscillating signal;

a first frequency converter for converting a signal with a first frequency band received by an antenna into an intermediate frequency signal with a prescribed frequency, based on the signal with the frequency divided by said frequency divider; and a second frequency converter for converting a signal with a second frequency band received by the antenna into the intermediate frequency signal with the prescribed frequency, based on the signal with the frequency divided by said frequency divider, wherein said first local oscillator outputs said first local oscillating signal with an equal frequency, even if performing transmission and reception.

According to the present invention, in a radio communication apparatus which after separating a selecting frequency component into an in-phase component and a quadrature component, and then converting each component into a digital signal by said first and second A/D converters, separates these digital signal into an in-phase component and a quadrature component, and performs a detecting process, a reference voltage of at least one of the first and second A/D converters is controlled so that a gain difference of each digital signal outputted from the first and second A/D converters becomes equal to or less than a prescribed value. Because of this, it is possible to effectively reduce the interference wave mixed in a base band signal; as a result, a receiving signal with a good S/N ratio and a high-quality is obtained.

Furthermore, the present invention automatically detects the gain difference of the in-phase component signal and the quadrature component signal. Because of this, it is unnecessary to fine-tune the gain difference by hand, as is the case with the conventional system, and it is possible to shorten the time which is necessary to a fabrication of the radio communication apparatus.

Furthermore, because the present invention does not change the frequency of a first local oscillating signal used for a conversion of the frequency and so on, it is possible to quickly change data sending and data receiving.

BRIEF DESCRIPTION OF THE DRAWINGS

FIG. 1 is a diagram showing a configuration of the digital decoding apparatus;

FIG. 3–FIG. 7 are frequency spectrum diagrams of each block in FIG. 1 and FIG. 2;

FIG. 8 is a diagram which compiles the processing operation of the interference wave suppression control block in FIG. 2;

FIG. 9A and FIG. 9B are diagrams showing a detailed configuration of the A/D converter in FIG. 1;

FIG. 10A and FIG. 10B are diagrams showing the output spectrum of the low pass filters;

FIG. 11 is a block diagram showing configuration of output stage of the AGC amplifiers;

FIG. 12 is a diagram showing a rule of high speed data transfer that an Europe electrical communication standard Institute (ETSI) has fixed;

FIG. 14 and FIG. 15 are block diagrams showing a configuration of the radio communication apparatus which is able to receive both of a GSM system and a DCS 1800 system;

FIG. 17 is a diagram which explains TDMA (time-division multiple access) in a mobile communication system called a GSM system.

DESCRIPTION OF THE PREFERRED EMBODIMENTS

Figure 2:
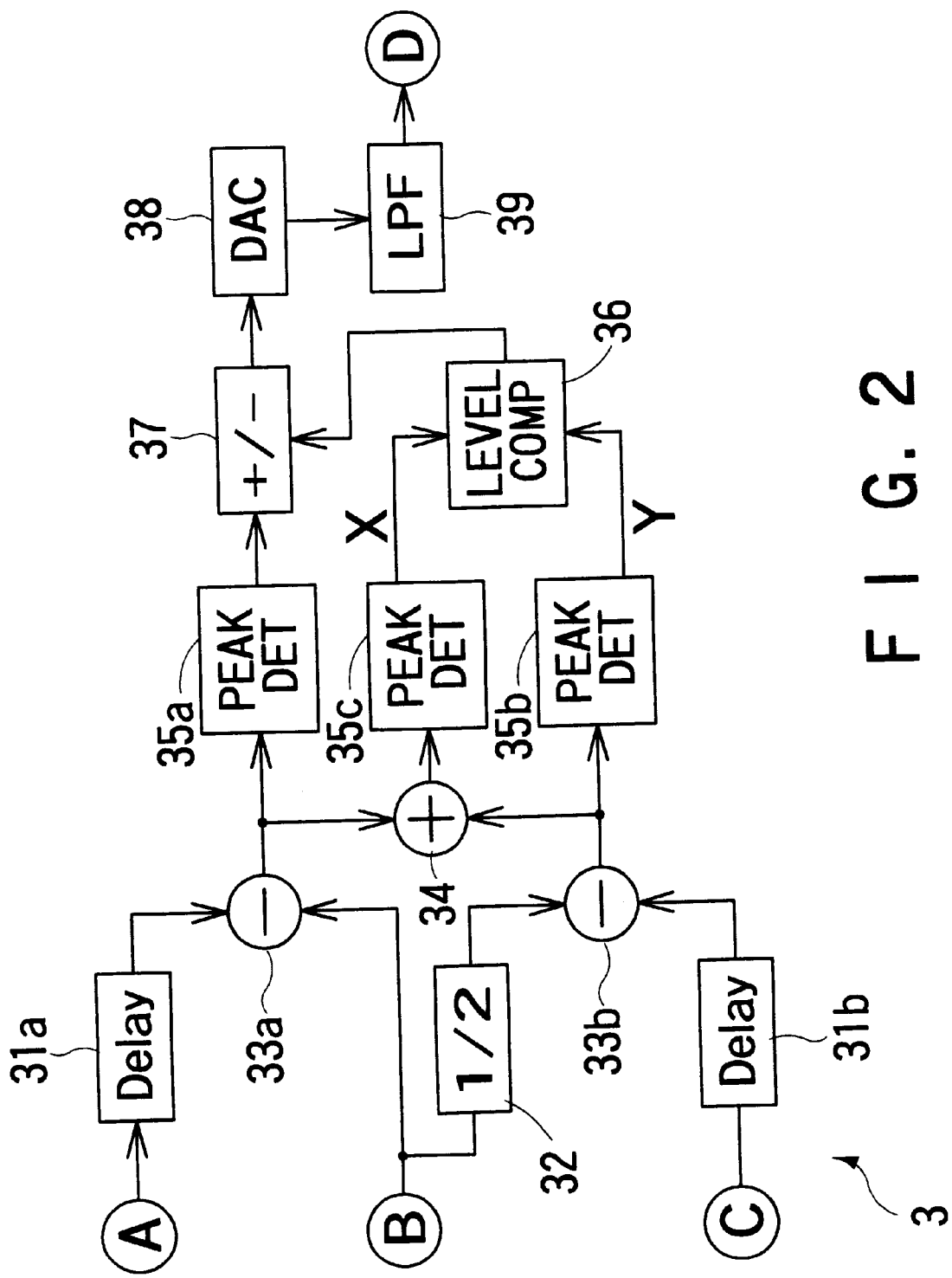
FIG. 2 is a diagram showing a detailed configuration of the interference wave suppression control block.

A radio communication apparatus according to the present invention is described in detail with reference to the attached drawings as follows.

(First embodiment)

Hereinafter, as a preferred embodiment of the radio communication apparatus, a digital decoding apparatus will be described. FIG. 1 is a diagram showing a configuration of the digital decoding apparatus in which a high frequency signal received by an antenna is converted into a base band signal. A digital decoding apparatus in FIG. 1 is separated into three parts, that is, an analog I/Q signal generator 1, a digital decoder 2, and an interference wave suppression control block 3.

The analog I/Q signal generator 1 comprises an antenna 11, a duplexer (DUP) 12, a low noise amplifier (LNA) 13, a band pass filter (BPF) 14, quadrature mixers 15a and 15b, a voltage control oscillator (VCO) 16, a 90° phase shifter 17, low pass filters (LPF) 18a and 18b, and automatic gain control (AGC) amplifiers 19a and 19b.

The duplexer 12 changes transmission and reception. The low noise amplifier 13 amplifies a high frequency signal which is received by the antenna 11 and passes through the duplexer 12. The band pass filter 14 cuts an unnecessary frequency component. The voltage control oscillator 16 outputs a local oscillating signal with a frequency in accordance with a selected frequency. The 90° phase shifter 17 outputs two types of signals. Phases of these signals differ by 90° from each other. One of these signals is inputted to the quadrature mixer 15a, and another is inputted to the quadrature mixer 15b. The quadrature mixer 15a separates and extracts an I signal being an in-phase component from an output of the band pass filter 14 based on the signal from the 90° phase shifter 17. On the other hand, the quadrature mixer 15b separates and extracts Q signal being an quadrature component from an output of a band pass filter 14.

The output of the quadrature mixers 15a and 15b are inputted to the low pass filters 18a and 18b, respectively, and only a low frequency component is extracted. Output levels of the low pass filters 18a and 18b are controlled by the AGC amplifiers 19a and 19b, respectively.

On the other hand, the digital decoder 2 shown in FIG. 1 comprises A/D converters 21a and 21b, a digital signal generator 22, double quadrature mixers 23a, 23b, 23c and 23d, adders 24a and 24b, low pass filters 25a and 25b, AGC amplifiers 26a and 26b, a peak detector 27, and a wave detector 28.

The A/D converters 21a and 21b converts the output signals of the AGC amplifiers 26a and 26b into digital data. As described later, a reference voltage of the A/D converter 21a is controlled by an output D of the interference wave suppression control block 3. The digital signal generator 23 outputs two types of signals of which the phases are different from each other. One of these signals is inputted to the double quadrature mixer 23a and 23c, and the other is inputted to the double quadrature mixer 23b and 23d. The doubled quadrature mixer 23a separates and extracts the signal of the in-phase component included in the output of the A/D converter 21a, based on the signal outputted from the digital signal generator 22. Similarly, the double quadrature mixer 23b separates and extracts the signal of the quadrature component included in the output of the A/D converter 21a. The double quadrature mixer 23c separates and extracts the signal of the in-phase component included in the output of the A/D converter 21b. The double quadrature mixer 23d separates and extracts the signal of the quadrature component included in the output of the A/D converter 21b.

The adder 24a adds both outputs of the double quadrature mixers 23a and 23d. The adder 24b adds both outputs of the double quadrature mixers 23b and 23c. The outputs of the adders 24a and 24b are inputted to the low pass filters 25a and 25b, respectively, and the high frequency component is eliminated, and then the outputs of the low pass filters 25a and 25b are inputted to the AGC amplifiers 26a and 26b, respectively. The AGC amplifiers 26a and 26b controls a signal level so that the output level becomes constant. The wave detector 27 performs a detecting process based on each output of the AGC amplifiers 26a and 26b.

On the other hand, as shown in FIG. 2, the interference wave suppression control block 3 comprises delay circuits 31a and 31b, a ½ amplitude converter 32, subtracters 33a and 33b, an adder 34, peak detectors 35a, 35b and 35c, a level comparator 36, a signal converter 37, a D/A converter (DAC) 38, and a low pass filter 39. An output A of the adder 24a in FIG. 1 and an output B of the low pass filter 25a are inputted to the interference wave suppression control block 3. An output D of the interference wave suppression control block 3 is inputted to the A/D converter 21a in FIG. 1. Based on the output of the A/D converter 21a, the reference voltage of the A/D converter 21a is controlled variably.

The delay circuit 31a in the interference wave suppression control block 3 delays a signal for almost the same period as would be necessary to pass through the low pass filter 25a in FIG. 1.

The subtracter 33a calculates the difference between each output of the delay circuit 31a and the low pass filter 25a in FIG. 1. The ½ amplitude converter 32 converts output amplitude of the low pass filter 25a in FIG. 1 into almost a half amplitude. The subtracter 33b calculates the difference between each output of the ½ amplitude converter 33 and the delay circuit 31b.

The peak detectors 35a and 35b detect a peak component included in each output of the subtracters 33a and 33b. The adder 34 adds each output of the subtracters 33a and 33b. The peak detector 35c detects a peak component included in the output of the adder 34. The level comparator 36 compares a magnitude of each peak component detected by the peak detectors 35b and 35c. The signal converter 37 changes a sign of the output of the peak detector 35a, based on the comparative result of the level comparator 36. The D/A converter 38 converts the output of the signal converter 37 into an analog signal. The low pass filter 39 eliminates an unnecessary high frequency component included in the output of the D/A converter 38.

FIG. 3–FIG. 7 are frequency spectrum diagrams of each block in FIG. 1 and FIG. 2. Hereinafter, with reference to these diagrams, the operation of the digital decoding apparatus according to the present invention shown in FIG. 1 and FIG. 2 will be described.

Figure 3:
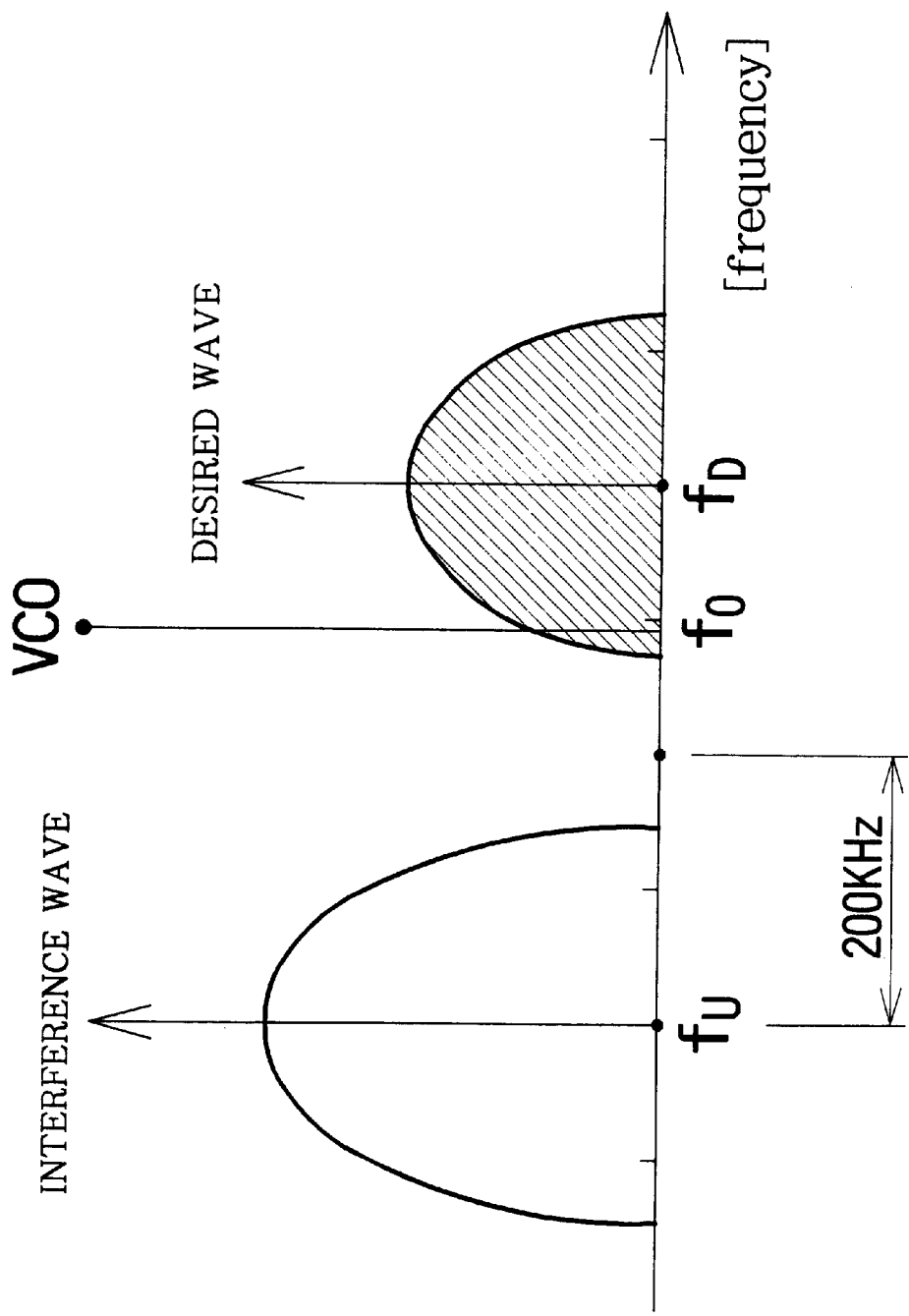

When a center frequency of a desired wave is expressed by fD, the frequency spectrum of the desired wave is showed by hatched area in FIG. 3. FIG. 3 shows an example in which the frequency interval of the radio channels is 200 kHz, and the signal corresponding to one channel is arranged in each cell. In this case, the interference wave, which centers on a frequency being 400 kHz away from the desired wave fD is occurred.

Figure 4A:
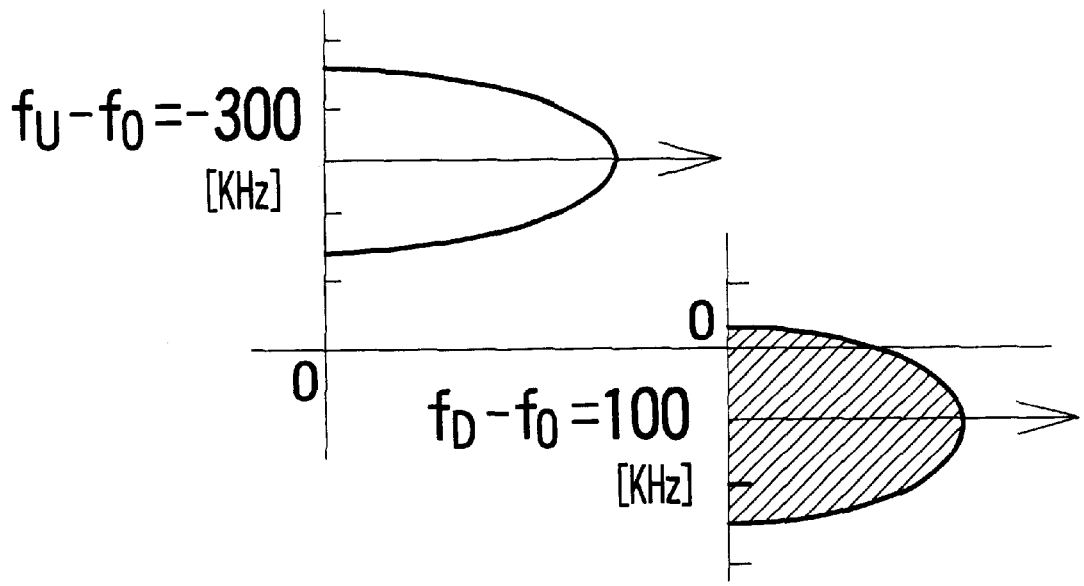
Figure 4B:
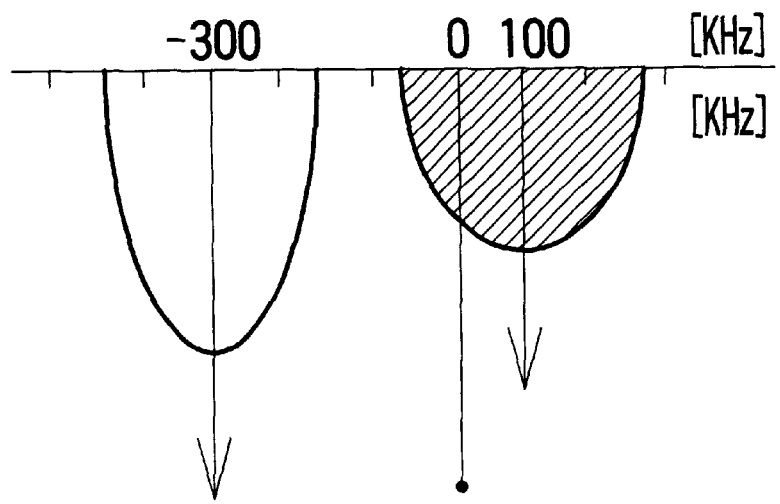

On the other hand, as shown in FIG. 3, the frequency of the local oscillating signal outputted from the voltage control oscillator 16 in FIG. 1 is set to a lower frequency than that of the desired wave by 100 kHz which is a half frequency of the channel interval frequency. Accordingly, as shown in FIG. 4A, the I signal as the in-phase component which is outputted from the quadrature mixer 15a is converted into the desired signal of which the center frequency is fD−f0=100 kHz and the interference signal of which the center frequency is fD−f0=−300 kHz. Similarly, as shown in FIG. 4B, the Q signal as the quadrature component is also converted into the desired signal of which the center frequency is 100 kHz and interference signal of which the center frequency is −300 kHz.

The signals outputted from the quadrature mixers 15a and 15b are inputted to the low pass filters 18a and 18b, respectively, and the high frequency component is eliminated. And then the outputs of the low pass filters 18a and 18b are inputted to the AGC amplifiers 19a and 19b and amplified.

The signal amplified by the AGC amplifiers 19a and 19b are inputted to the A/D converters 21a and 21b, and converted into the digital signal. The output of the A/D converter 21a is inputted to the double quadrature mixers 23a and 23b, and the output of the A/D converter 21b is inputted to the double quadrature mixers 23c and 23d.

The digital signal generator 22 supplies the double quadrature mixers 23a and 23c with the in-phase component signal, that is, a cosine component signal of the local oscillating signal of 100 kHz, and supplies the double quadrature mixers 23b and 23d with the quadrature component signal, that is, a sine component signal of the local oscillating signal.

The frequency spectrum of the output signals of the double quadrature mixers 23a, 23b, 23c and 23d is expressed by FIG. 5A, FIG. 5B, FIG. 5C and FIG. 5D, respectively. The desired wave and the interference wave are included in the output of the double quadrature 23a, 23b, 23c and 23d. As shown an hatched area in FIG. 5, the desired wave includes a base band signal of which the center frequency is 0 kHz and a signal of which the center frequency is 200 kHz. The interference wave includes a signal of which the center frequency is −200 kHz, and a signal (not shown) of which the center frequency is 400 kHz.

The output of the double quadrature mixer 23a and 23b is added by the adder 24a. FIG. 6A is a diagram showing a frequency spectrum of the output of the adder 24a. A base band signal of which the center frequency is 0 kHz and signals of which the center frequency are 200 kHz and 400 kHz. The amplitude of the base band signal is twice larger than that of an input amplitude. The signal of which the center frequency is 200 kHz includes the desired wave and a remnant component of the interference wave. The signal of which the center frequency is 400 kHz includes a remnant component of the interference wave. Thus, the reason why the remnant component emerges is that when passing through the quadrature mixers 15a and 15b, the low pass filters 18a and 18b, the AGC amplifiers 19a and 19b, and the A/D converters 21a and 21b, the gain difference and the phase difference occurs between the in-phase component (I signal) and the quadrature component (Q signal). Because the cause that the phase difference occurs is very little, a main cause that the remnant component occurs is the gain difference.

As shown in FIG. 6A, the base band signal and the remnant component signal overlaps partially. The overlapped region R corresponds to a noise, and the region R gives a bad influence for the decoding signal.

The output of the adder 24a is inputted to the low pass filter 25a, and as shown in FIG. 6B, the high frequency component is eliminated by the low pass filter 25b. By passing through the low pass filter 25a, most of the remnant component is eliminated. However, the remnant component in the overlap region R remains.

Similarly, the adder 24b adds both outputs of the double quadrature mixers 23b and 23c, and then the low pass filter 25b eliminates the high frequency component included in the output of the adder 24b.

The outputs of the low pass filter 25a and 25b are inputted to the AGC amplifiers 26a and 26b, respectively and controlled so that the signal level become constant. More specifically, each output of the AGC amplifiers 26a and 26b is detected by the peak detector 27, and then the detected peak value is fedback to the AGC amplifiers 26a and 26b. In this way, the signal level of the AGC amplifiers 26a and 26b is controlled.

Figure 7A:
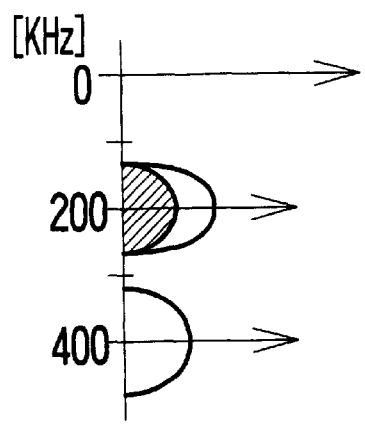
Figure 7B:
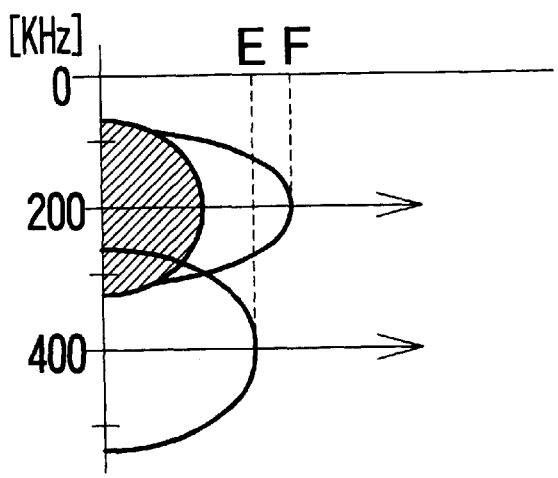

On the other hand, the delay circuit 31a in the interference wave suppression control block 3 of which the detailed configuration is shown in FIG. 2 delays the output of the adder 24a in FIG. 1 for the same period as delay of the low pass filter 25a in FIG. 1. The subtracter 33a calculates and outputs the difference of each output of the delay circuit 31a and the low pass filter 25a. As shown in FIG. 7A, the subtracter 33a outputs the remnant interference signal including a 200 kHz component and a 400 kHz component. On the other hand, as shown in FIG. 7B, the subtracter 33b outputs the desired signal and the interference signal with the frequency components of 200 kHz and 400 kHz. The output of the subtracter 33b is determined as a reference level.

The output of the subtracter 33b is inputted to the peak detector 35b, and the peak level is detected. In FIG. 7B, the peak level of the signal of which the center frequency is 400 kHz is expressed as "E", and the peak level of the signal of which the center frequency is 200 kHz is expressed as "F".

Figure 7C:
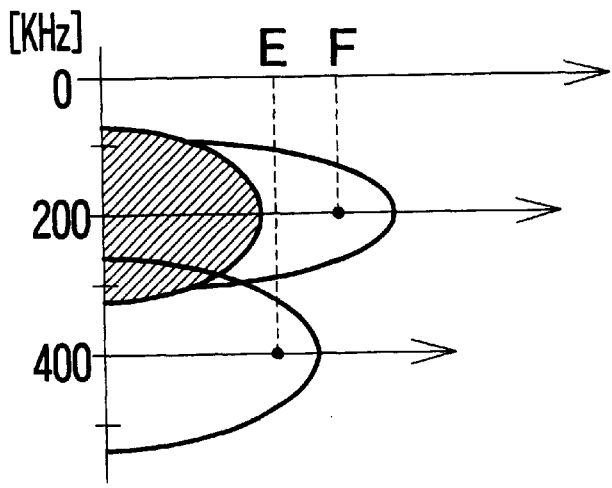

FIG. 7C is a diagram showing an output spectrum of the adder 34 which adds each output of the subtracters 33a and 33b. FIG. 7C shows an example that the peak level of the signals of which the center frequencies are 200 kHz and 400 kHz is larger than the output of the subtracter 33b shown in FIG. 7B. The peak detector 35c detects an output peak level of the adder 34 by each 200 kHz. The detected peak level is sent to the level comparator 36. The level comparator 36 performs a peak determination. In accordance with the result of the peak determination, the signal converter 37 changes the sign of the output of the peak detector 35a.

FIG. 8 is a diagram which compiles the processing operation of the interference wave suppression control block 3 in FIG. 2. In FIG. 2, the output of the peak detector 35c is expressed as "X", and the output of the peak detector 35b is expressed as "Y". As shown in FIG. 8, when a relationship of X>Y is established, the output of the level comparator 36 becomes plus, and it is determined that the in-phase component signal (I signal) is larger than the quadrature component signal (Q signal). In this case, a control which raises the reference voltage is performed. Accordingly, the output of the A/D converter 21a becomes small, and the in-phase component signal also becomes small, because the gain decreases.

On the other hand, when a relationship of X<Y is established, the output of the level comparator becomes minus, and it is determined that the in-phase signal (I signal) is smaller than the quadrature component signal (Q signal). In this case, a control which lowers the reference voltage is performed. Accordingly, the output of the A/D converter 21a becomes large, and the in-phase component signal also becomes large, because the gain increases.

FIG. 9 is a diagram showing a detailed configuration of the A/D converter 21a in FIG. 1. The A/D converters in FIG. 9 are called a parallel type conversion system, FIG. 9A is a diagram showing an example having only a power supply voltage and FIG. 9B is a diagram showing an example having plus and minus power supply voltages.

The A/D converter of FIG. 9A comprises a resister array 51 constituted by a plurality of resisters connected in series, a plurality of comparators connected between each resister, an encoder 53 which codes the output of the comparator 52, and an adder 54 connected to one end of the resister array 51. The adder 54 generates a reference voltage by adding a prescribed voltage and the output voltage of the interference wave suppression control block 3 in FIG. 2. Because the reference voltage being the output voltage of the adder 54 is applied to one end of the resister array 51, when a value of each resister is equal, the voltage between each resister is expressed as a fraction with a numerator of 1 (i.e. 1/2, 1/3, 1/4 and so on).

If the output of the interference wave suppression control block 3 is a positive voltage, the reference voltage applied to one end of the resister array 51 becomes high, and a digital value after the A/D conversion becomes small. On the other hand, when the output of the interference wave suppression control block 3 is a negative voltage, the reference voltage becomes small, and the digital value after the A/D conversion becomes large.

Furthermore, the A/D converter in FIG. 9B comprises adders 54a and 54b connected to both ends of the resister array 51, and a buffer 55 which outputs signals with a positive logic and a negative logic. The adder 54a generates a first reference voltage by adding the positive output and the prescribed voltage VREF. The adder 54b generates a second reference voltage by adding the inverse voltage of the buffer 55 and an inverse voltage (−VREF) of the prescribed voltage VREF.

Even in FIG. 9B, if the positive voltage is outputted from the interference wave suppression control block 3, the digital value after the A/D conversion becomes small. On the other hand, if the negative voltage is outputted from the interference wave suppression control block 3, the digital value after the A/D conversion becomes large.

By the above-mentioned processes, the output spectrum of the low pass filters 25a and 25b is shown in FIG. 10A and FIG. 10B, respectively. Even in the in-phase component shown in FIG. 10A or even in the quadrature component shown in FIG. 10B, the base band signal does not suffer the influence of the interference signal having an adjacent frequency, that is, 200 kHz.

The outputs of the low pass filter 25a and 25b are inputted to the wave detector 28 via the digital AGC amplifiers 26a and 26b, and the logic of the digital signal, for example "0" or "1" is determined. Furthermore, the peak detector 27 calculates a square sum $\sqrt{(I^2+Q^2)}$, detects sampling points with a prescribed range, and then generates the control voltages of the AGC amplifiers 26a and 26b.

Thus, in the digital decoding apparatus that after the A/D converter changes the in-phase component and the quadrature component separated by the quadrature mixers 51a and 51b into the digital data, the double quadrature mixers 23a, 23b, 23c and 23d separates the digital data into the in-phase component and the quadrature component, and then the detecting process is performed, the reference voltage of the A/D converter 21a is controlled variably so that the gain difference of the in-phase component and the quadrature component is reduced, based on the output of the double quadrature mixers 23a, 23b, 23c and 23d. Because of this, the interference wave is not mixed to the base band signal of the desired wave, and the receiving signal which does not suffer the influence of the interference wave and has a good S/N ratio is obtained. Furthermore, because it is unnecessary to control the gain difference and the phase difference of the in-phase component and the quadrature component by hand, it is possible to reduce a time which is necessary to a fabrication of the digital decoding apparatus.

In FIG. 1 and FIG. 2, though the example that variably controls the reference voltage of the A/D converter 21a in accordance with the output of the interference wave suppression control block 3 has been explained, instead of the A/D converter 21a, or with the A/D converter 21a, the reference voltage of the A/D converter 21b may be controlled variably.

The above-mentioned embodiment has explained the example which inputs the in-phase component signal to the delay circuit 31a, the subtracter 33a and the ½ amplitude converter 32 in FIG. 2, and inputs the quadrature component signal to the delay circuit 31b. However, the in-phase signal may be inputted to the delay circuit 31b.

(Second embodiment)

A second embodiment has a feature in that it is possible to simplify a circuit configuration by combining, into one A/D converter, two A/D converters 21a and 21b for converting the output of the AGC amplifiers 19a and 19b in FIG. 1.

FIG. 11 is a block diagram showing a configuration of an output stage of the AGC amplifiers 19a and 19b. As shown in FIG. 11, the I signal outputted from the AGC amplifier 19a and the Q signal outputted from the AGC amplifiers 19b are inputted to the sign changer 61, and either the I signal or the Q signal is selected.

The output of the sign changer 61 is inputted to the A/D converter 62, and converted into a digital signal. The reference voltage of the A/D converter 62 changes in sync with changing of the sign changer 61.

The output of the A/D converter 62 is separated into two routes. The signal of one route is delayed by the delay circuit 63 for a prescribed period, and then inputted to the double quadrature mixers 23a and 23b. The signal of another route is directly inputted to the double quadrature mixers 23c and 23d shown in FIG. 1. Then, the same processes as that of the first embodiment is performed. That is, the delay circuit 63 performs a timing control of the I signal and the Q signal.

Thus, because the second embodiment compiles two pieces of the A/D converters 21a and 21b in FIG. 1 into one piece, it is possible to simplify the circuit configuration.

(Third embodiment)

The third embodiment has a feature in that it is possible to quickly change transmission and reception of data, without using a frequency synthesizer capable of quickly changing the frequency.

FIG. 12 is a diagram showing a rule of high speed data transfer that an Europe electrical communication standard Institute (ETSI) has fixed. In this rule, the data transfer (TCH/F4.8) with data speed of 4.8 kbps and the data transfer (TCH/F9.6) with data speed of 9.6 kbps is prescribed.

Figure 13:
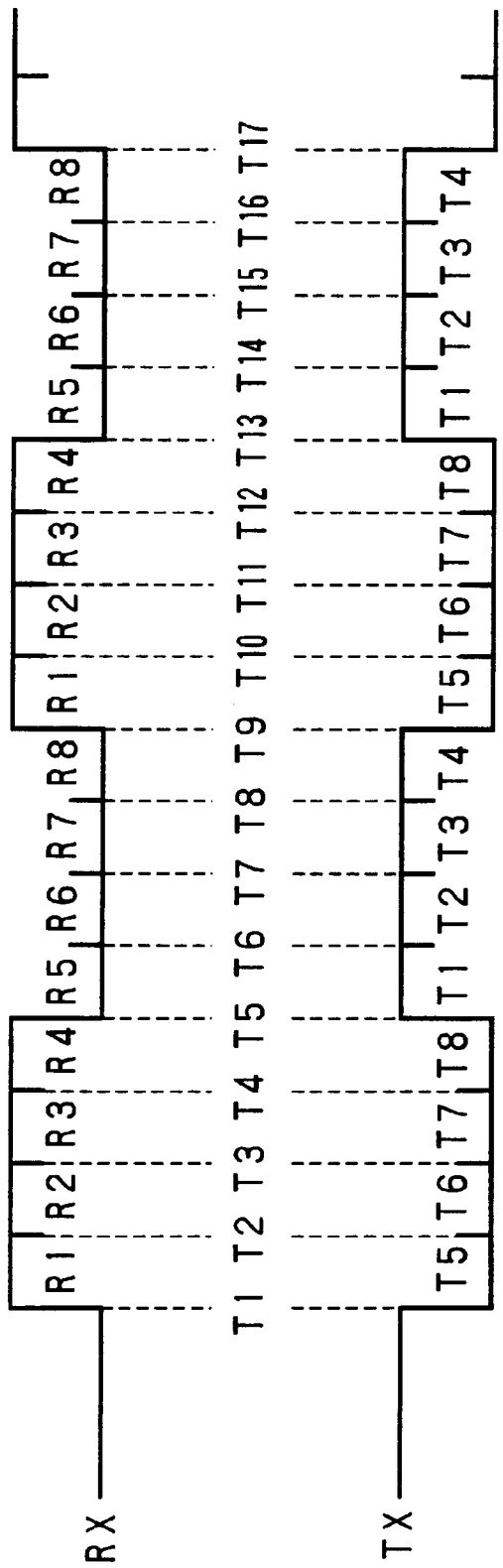
FIG. 13 is a timing diagram on the occasion of performing transmission and reception of data by using 4 time-slots.

For example, in the TCH/F9.6, in order to obtain an AIUR (Air Interface User Ratio), the four time-slots are necessary. FIG. 13 is a timing diagram in case of performing transmission and reception of data by using 4 time-slots. As shown in points T5, T9, T13 and T17, the present embodiment has a feature in that it is possible to quickly change transmission and reception of data.

Hereinafter, the third embodiment of the radio communication apparatus according to the present invention will be described in detail.

Figure 14:
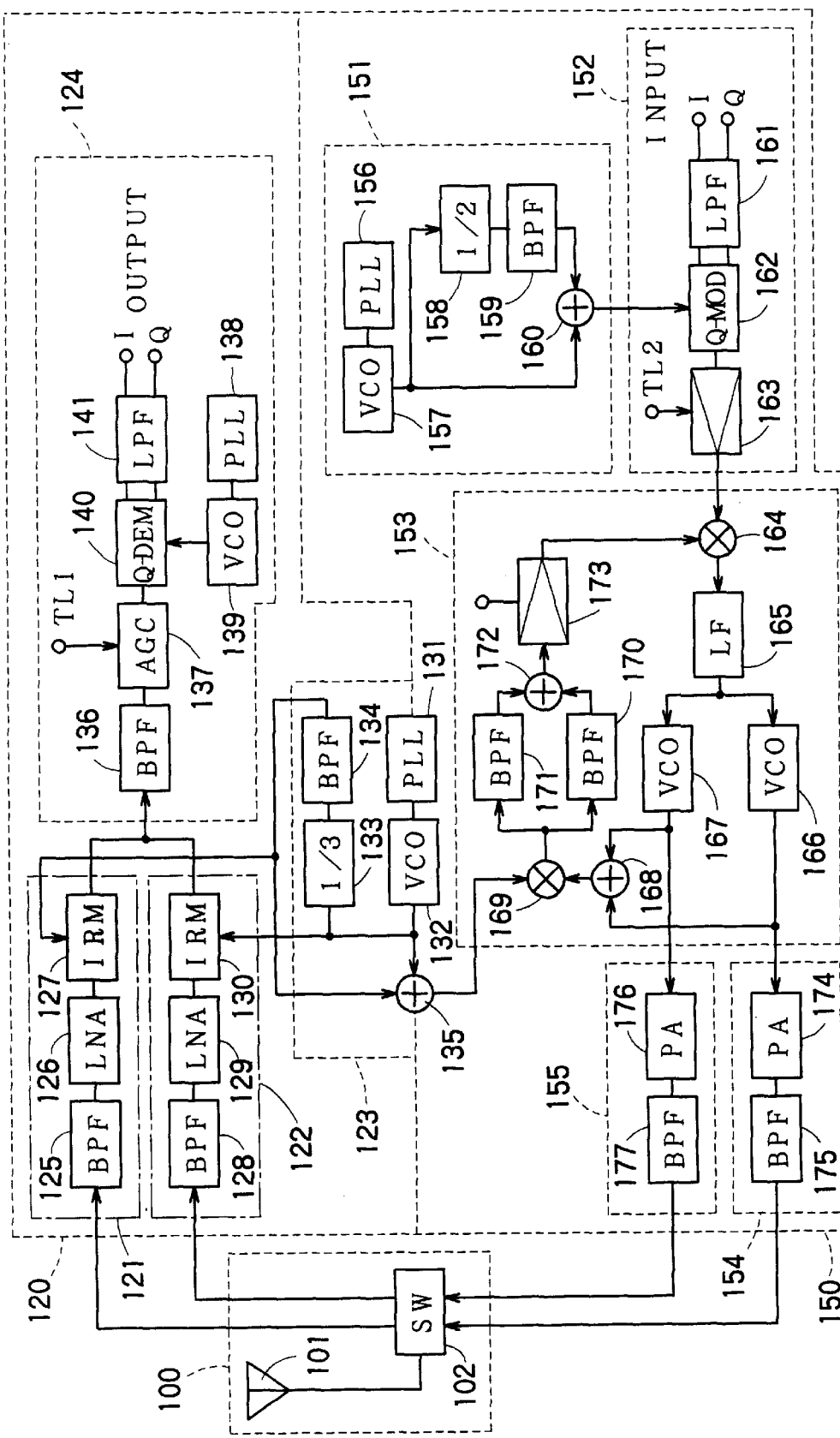

FIG. 14 and FIG. 15 are block diagrams showing a configuration of the radio communication apparatus corresponding to both of a GSM system and a DCS 1800 system, so-called a dual band type radio communication apparatus. The radio communication apparatus in FIG. 14 and FIG. 15 assumes that the sending band for the GSM is 880–915 MHz, the receiving band for the GSM is 925–960 MHz, the sending band for the DCS1800 is 1710–1785 MHz, and the receiving band for the DCS1800 is 1805–1880 MHz. A voltage control oscillator (VCO) for a local oscillator is selected so as to cover all the frequency band of the GSM and the DCS1800.

In FIG. 14, inside of a dash-single-dot line corresponds to only the GSM, inside of a dash-double-dot line corresponds to only the DCS1800, and the other corresponds to both the GSM and the DCS1800.

The radio communication apparatus in FIG. 14 and FIG. 15 comprises an antenna input block 100, a reception block 120, a transmission block 150, and an in/out block 200. The configuration of the in/out block 200 is shown in FIG. 15, and the configuration of the other is shown in FIG. 14.

The antenna input block 100 includes an antenna 101, and a sign changer (SW) which connects either the reception block 120 or the transmission block 150 to the antenna 101.

The reception block 120 includes a frequency converter 121 for the GSM, a frequency converter 122 for the DCS1800, a local oscillator 123 and a decoding block 124. The frequency converter 121 includes a band pass filter (BPF) 125, a low noise amplifier (LNA) 126, an image reduced type mixer (IRM) 127. The frequency converter 122 includes a band pass filter (BPF) 128, a low noise amplifier (LNA) 129, and an image reduced type mixer (IRM) 130. The local oscillator 123 includes a PLL circuit (synthesizer) 13 1, a voltage control oscillator (VCO) 132, a ⅓ frequency divider 133, a band pass filter (BPF) 134, and an adder 135. The decoder 124 includes a band pass filter (BPF) 136, an automatic gain control (AGC) circuit 137, a PLL circuit 138, a voltage control oscillator (VCO) 139, a quadrature demodulator (Q-DEM) 140 and a low pass filter (LPF) 141.

The transmission block 150 includes a local oscillator 151, a modulation block 152, a phase control block 153, a sending signal output block 155 for the GSM, and a sending signal output block for the DCS1800.

The local oscillating block 151 includes a PLL circuit 156, a voltage control oscillator (VCO) 157, a ½ frequency divider 158, a band pass filter (BPF) 159, and an adder 160. The modulation block 152 includes a low pass filter (LPF) 161, a quadrature modulation block (Q-MOD) 162, and an amplifier 163. The phase control block 153 includes a phase shift circuit 164, a loop filter (LF) 165, a voltage control oscillator (VCO) 166 for the GSM, a voltage control oscillator (VCO) 167 for the DCS1800, an adder 168, a mixer 169, band pass filter (BPF) 170 and 171, an adder 172 and an amplifier 173.

The sending signal output block 154 includes a power amplifier (PA) 174 and a band pass filter (BPF) 175. The sending signal output block 155 includes a power amplifier (PA) 176 and a band pass filter (BPF) 177.

The in/out block 200 includes an A/D converter 201, a D/A converter 202, a viterbi decoder 203, a compander 204, a D/A converter 205, a speaker 206 and a microphone 207.

Next, the operation of the radio communication apparatus in FIG. 14 and FIG. 15 will be explained. First of all, transmission and reception of data in the GSM mode is explained. A radio frequency (RF) signal for the GSM inputted from the antenna 101 is switched by the sign changer 102 and inputted to the band pass filter 125. The signal which has passed through the band pass filter 125 is amplified by the low noise amplifier 126, and then inputted to the image reduced type mixer 127.

On the other hand, the voltage control oscillator 132 of which the phase is controlled by the PLL circuit 131 outputs an oscillating signal with frequency band of 2130–2235 MHz on the occasion of receiving the signal of the GSM frequency band. After the output signal of the voltage control oscillator 132 is converted into a third frequency by the ⅓ frequency divider, the output signal of the ⅓ frequency divider is inputted to the band pass filter 134 and a higher harmonic wave component is reduced. And then the output signal of the band pass filter 134 is inputted to another input terminal of the image reduced type mixer 127. The image reduced type mixer 127 generates an intermediate frequency (IF) signal of 215 MHz which is differential frequency. The IF signal is inputted to the band pass filter 136, and the higher harmonic wave component is reduced, and then it is inputted to the AGC amplifier 137.

The AGC amplifier 137 controls the gain so that the output signal does not distort by a signal inputted to a terminal TL1 in FIG. 14. The output signal of the AGC amplifier 137 is inputted to the quadratre demodulator 140 of next stage, and is mixed with the oscillating signal of 215 MHz outputted from the voltage control oscillator 139. The quadrature demodulator 140 outputs the I signal of the in-phase component and the Q signal of the quadrature component. The output of the quadrature demodulator 140 is inputted to the low pass filter 141, and after the higher harmonic wave component is reduced, the output of the loop filter 141 is inputted to the A/D converter 201 shown in FIG. 15. The output of the A/D converter 201 is inputted to the viterbi demodulator 203, and after the detecting process is performed, the output of the viterbi demodulator 203 passes through the compander 204. Next, the output of the viterbi demodulator 203 is converted into a voice signal by the D/A converter 205 and outputted from the speaker 206.

For example, in order to obtain the transfer rate of 38.4 kbit/s by the TCH/F9.6 standard, during the continuous four time-slots between times R1–R4 the above-mentioned receiving process is performed.

After a reception process for four time-slots finishes, a transmission process is performed. Even if switching from the reception process to the transmission process, the oscillating frequency of the voltage control oscillator 132 does not change. The voice signal inputted from the microphone 207 in FIG. 15 is inputted to the viterbi demodulator 203 via the compander 204, and separated into the I signal and the Q signal. After the I signal and Q signal are converted into the analog signal by the D/A converter 202, they are inputted to the low pass filter 161 in FIG. 14, and the higher harmonic wave signal is reduced. And then the output of the low pass filter 161 is inputted to the quadrature modulator 162 and modulated.

Furthermore, a signal of 170 MHz which is generated by dividing the frequency signal of 340 MHz outputted from the voltage control oscillator 157 into a half frequency by the ½ frequency divider 158 is inputted to the quadrature modulator 162. By using the output of the ½ frequency divider 158, the quadrature modulator 162 outputs a GMSK signal with 170 MHz band. The band pass filter 159 reduces the higher harmonic wave component included in the base band signal of 170 MHz outputted from the ½ frequency divider 158.

The output of the quadrature modulator 162 is inputted to the amplifier 163. The gain of the amplifier 163 is controlled in accordance with a control voltage inputted to the terminal TL2. The output of the amplifier 163 is inputted to the phase comparator 164. The phase comparator 164 compares the phase of each output of the amplifiers 163 and 173, and outputs a signal in accordance with the phase difference.

The output of the phase comparator 164 is inputted to the loop filter 165, and the higher harmonic wave component is reduced. The output of the loop filter 165 is inputted to the voltage control oscillator 166. The voltage control oscillator 166 outputs a signal with a frequency band of 880–915 MHz.

The mixer 169 in the phase control block 153 multiplies the output signal of the voltage control oscillator 166 by a signal with a frequency band of 710–745 MHz which is obtained by dividing the frequency of the output signal of the voltage control oscillator 132 into a third, and outputs a signal of 170 MHz which is a differential frequency of both signals. The output of the mixer 169 is inputted to the band pass filter 170, and the higher harmonic wave component is reduced. And then the output of the band pass filter 170 is amplified by the amplifier 173 and then inputted to the phase comparator 164. The output of the phase comparator 164 is fedback via the loop filter 165, the voltage control oscillator 166, and the mixer 169.

After the output power of the voltage control oscillator 166 is amplified by the power amplifier 174, the higher harmonic wave component is reduced by the band pass filter 175, and the output of the band pass filter 175 is inputted to the antenna 101 via the sign changer 102.

In order to obtain a transfer rate of 38.4 kbit/s with TCH/F9.6 standard in FIG. 12, during four time-slots of the point T1–T4 in FIG. 13, the above-mentioned transmission process is performed.

Next, the data transfer in the DCS1800 mode will be explained. The RF signal (1800–1880 MHz) for the DCS1800 inputted from the antenna 101 is switched by the sign changer 102, and is inputted to the band pass filter 128. The signal which passes through the band pass filter 128 is amplified by the low noise amplifier 129 and inputted to the image reduced type mixer 130.

On the other hand, when receiving the signal with the frequency band of the DCS1800, the voltage control oscillator 132 of which the phase is controlled by the PLL circuit 131 outputs an oscillating signal with a frequency band of 2025–2095 MHz. The image reduced type mixer 130 generates an output signal of the voltage control oscillator 132 and an IF signal of 215 MHz which is a differential frequency between the output signal of the voltage control oscillator 132 and the RF signal. After the higher harmonic wave component included in the IF signal is reduced by the band pass filter 136, the output of the band pass filter 136 is amplified by the AGC amplifier 137, and the I signal and the Q signal are extracted.

Even if switched from data reception to data transmission in the DCS1800 mode, the oscillating frequency of the voltage control oscillator 132 does not change. Furthermore, the voltage control oscillator 157 outputs the oscillating signal of 310 MHz. The signal is inputted to the quadrature modulator 162 via the adder 135. The quadrature modulator 162 outputs the modulating signal with the base band signal of 310 MHz.

The output of the quadrature modulator 162 is inputted to the amplifier 163, the gain of the output is controlled in accordance with a control voltage inputted to a terminal TL2. The phase comparator 164 compares the phase of each output signal of the amplifiers 163 and 173, and outputs a signal in accordance with the phase difference.

The output of the phase comparator 164 is inputted to the low pass filter 165, and after the higher harmonic wave component is reduced, the output of the low pass filter 165 is inputted to the voltage control oscillator 167. The voltage control oscillator 167 outputs a signal with a frequency band of 1710–1785 MHz.

The mixer 169 in the phase control block 153 multiplies the output signal of the voltage control oscillator 132 by the output signal of the voltage control oscillator 167, and outputs the signal of 310 MHz which is the differential frequency of both signals. After the signal of 310 MHz is inputted to the band pass filter 171 and the higher harmonic wave component is reduced, the output of the band pass filter 171 is amplified by the amplifier 173 and inputted to the phase comparator 164.

After the output power of the voltage control oscillator 167 is amplified by the power amplifier 176, the higher harmonic component is reduced by the band pass filter 177, and the output of the band pass filter 177 is inputted to the antenna 101 via the sign changer 102.

As described above, because in the third embodiment, the frequency of the voltage control oscillator at the time of transmitting data is equal to that at time of receiving data, it is possible to quickly change transmission and reception of data. Accordingly, it is possible to effectively use each time-slot, and to transfer data at high speed.

Furthermore, in the above-mentioned embodiment, the variable range of the frequency of the voltage control oscillator 132 is 2020–2235 MHz, which is sum of the variable range of the frequency of the GSM mode and the DCS1800 mode, and the frequency difference Δf is 30 MHz.

On the other hand, a variable range of the frequency in the voltage control oscillator 157 MHz is 310–340 MHz, and the frequency difference Δf is 30 MHz.

It is undesirable to enlarge the variable range of the frequency, because stability and reality of the voltage control oscillator 132 and 157 generally lower. That is, it is desirable to narrow the variable range of the frequency.

Figure 16:
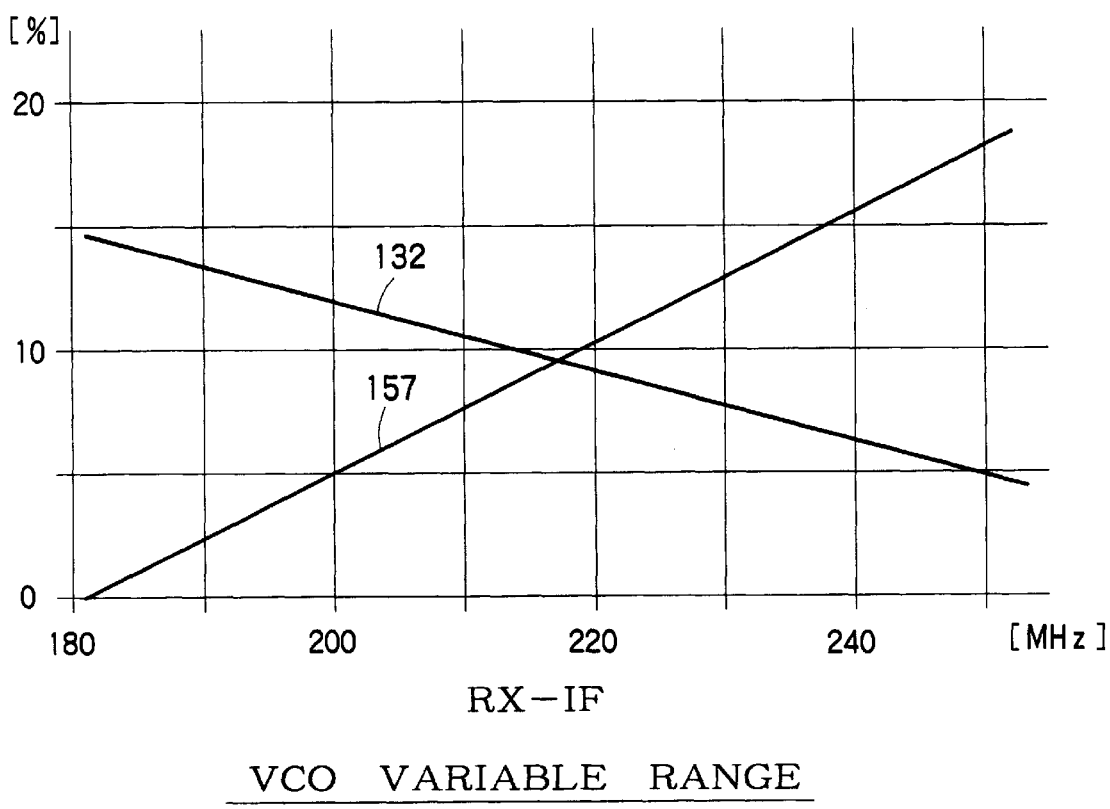
FIG. 16 is a diagram that a quadrature axis is the frequency (MHz) of a received IF signal and a longitudinal axis is the ratio of the variable range of the voltage control oscillators.

FIG. 16 is a diagram that a quadrature axis is the frequency (MHz) of received IF signal and a longitudinal axis is the ratio (%) of the variable range of the voltage control oscillators 132 and 157. As shown in FIG. 16, both of the voltage control oscillator 132 and 157 stabilizes when the IF signal is about 215 MHz. The ratio of the variable range on this occasion is 9%. It is easy to realize the variable range of about 9%. Because of this, the present embodiment sets the IF signal to 215 MHz. However, the IF signal may be set to the frequency besides 215 MHz.

In the above-mentioned embodiment, an example which continues transmission and reception of data during continuous four time-slots has been explained. However, the number of the time-slots which continuously performs transmission and reception of data is not limited.

Furthermore, an example which the frequency of the voltage control oscillator 139 is constant, for example, 214 MHz, and the frequency of the voltage control oscillator 157 varies with a range of 310–340 MHz has been explained. However, the voltage control oscillator 139 may be oscillated by twice frequency, that is, 428 MHz, and the voltage control oscillator 157 may be oscillated by four times frequency. Furthermore, the voltage control oscillator 157 may be oscillated with four times frequency, that is, 1240–1360 MHz. In this case, after the frequency divider which divides the frequencies of these oscillating signals into ½ or ¼ generate a 90° phase difference signal, the 90° phase difference signal may be supplied to the quadrature modulator 162 and the quadrature demodulator 140.

What is claimed is:

1. A radio communication apparatus, comprising:
    a first in-phase/quadrature component separating circuit for separating a selecting frequency component included in a signal received by an antenna into an in-phase component signal and a quadrature component signal;
    a first A/D converter for outputting a digital signal obtained through an A/D converter of the in-phase component signal separated by said first in-phase/quadrature component separating circuit;
    a second A/D converter for outputting a digital signal obtained through an A/D conversion of the quadrature component signal separated by said first in-phase/quadrature component separating circuit;
    a detecting circuit for performing a detecting process based on the digital signals outputted from said first and second A/D converters;
    a second in-phase/quadrature component separating circuit for separating the digital signal outputted from said first A/D converter into the in-phase component signal and the quadrature component signal;
    a third in-phase/quadrature component separating circuit for separating the digital signal outputted from said second A/D converter into the in-phase component signal and the quadrature component signal; and
    an interference wave suppression control circuit for controlling at least one of reference voltages of said first and second A/D converters based on each signal separated by said second and third in-phase/quadrature component separating circuits, so that the gain difference of each digital signal outputted from said first and second A/D converters is equal to or less than a prescribed value.

2. The radio communication apparatus according to claim 1, comprising:
    a first adder for adding the in-phase component signal separated by said second in-phase/quadrature component separating circuit and the quadrature component signal separated by the third in-phase/quadrature component; and a second adder for adding the second quadrature component signal separated by said second in-phase/quadrature component separating circuit and the in-phase component signal separated by the third in-phase/quadrature component separating circuit, wherein said interference wave suppression control circuit controls at least one of said reference voltages of said first and second A/D converters based on the output of either said first adder or said second adder.

3. The radio communication apparatus according to claim 2, further comprising:

a first low pass filter for reducing a high frequency component included in an output of said first adder; and a second low pass filter for reducing the high frequency component included in an output of said second adder, wherein said detecting circuit performs a detecting process based on the outputs of said first and second low pass filters; and said interference wave suppression control circuit controls the reference voltage of said first A/D converter based on the in-phase component signal separated by said second in-phase/quadrature component separating circuit, the output of said first adder, and the output of said first low pass filter.

4. The radio communication apparatus according to claim 3, wherein said interference wave suppression control circuit includes:

a first delay circuit for delaying the output signal of said first adder for almost the same period as would be necessary to pass through said first low pass filter;

a second delay circuit for delaying the in-phase component signal separated by said second in-phase/quadrature component separating circuit for a period necessary to pass through said first adder and said first low pass filter;

an amplitude converting circuit for converting the output amplitude of said first low pass filter into almost a half value, a first subtracter for calculating and outputting a difference between the output of said first delay circuit and the output of said first low pass filter;

a second subtracter for calculating and outputting a difference between the output of said amplitude converting circuit and the output of said second delay circuit;

a third adder for adding the outputs of said first and subtracters;

a first peak detector for detecting a peak level of the output of said first subtracter;

a second peak detector for detecting the peak level of the output of said second subtracter;

a third peak detector for detecting the peak level of the output of said third subtracter;

a level comparator for comparing an amplitude level of the outputs of said second and third peak detectors;

a sign changer for outputting the peak level detected by said first peak detector with plus or minus sign attached thereto;

a D/A converter for converting the output of said sign changer into an analog signal; and a third low pass filter for reducing a high frequency component included in the output of said D/A converter, wherein a reference voltage of said first A/D converter is controlled based on the output of said third low pass filter.

5. The radio communication apparatus according to claim 4, wherein said interference wave suppression control circuit raises the reference voltage of said first A/D converter when the output level of said third peak detector is higher than that of said second peak detector, and lowers the reference voltage of said first A/D converter when the output level of said third peak detector is lower than that of said second peak detector.

6. The radio communication apparatus according to claim 1, wherein at least one of said first and second A/D converters includes a fourth adder for generating said reference voltage by adding a prescribed voltage of which the voltage level is constant and the output voltage of said interference wave suppression control circuit, a voltage dividing circuit for outputting a plurality of voltages which are generated by dividing said reference voltage at a prescribed ratio, a plurality of comparators for comparing analog input voltages with each voltage outputted from said voltage dividing circuit, and an encoder for converting said analog input signal into the digital signal based on the comparative result of said comparator.

7. The radio communication apparatus according to claim 1, wherein at least one of said first and second A/D converters includes a reference voltage generating circuit for generating said reference voltage based on a difference between a voltage obtained by adding a prescribed voltage of which the voltage level is constant and the output voltage of said interference wave suppression control circuit, and a voltage obtained by adding an inverse voltage of said prescribed voltage and an inverse output voltage of said interference wave suppression control circuit, a voltage dividing circuit for outputting a plurality of voltages which are generated by dividing said reference voltage at a prescribed ratio, a plurality of comparators for comparing an analog input voltage with each voltage outputted from said voltage dividing circuit, and an encoder for converting said analog input signal into the digital signal, based on the comparative result of said comparators.

8. A radio communication apparatus, comprising:

a first in-phase/quadrature component separating circuit for separating a selecting frequency component included in a signal received by an antenna into an in-phase component signal and a quadrature component signal;

a signal selecting circuit for selecting either the in-phase component signal or the quadrature component signal separated by said first in-phase/quadrature component separating circuit;

an A/D converter for outputting a digital signal obtained through an A/D conversion of the signal selected by said signal selecting circuit;

a delay circuit for delaying the digital signal outputted from said A/D converter;

a second in-phase/quadrature component separating circuit for separating the output of said delay circuit into an in-phase component signal and the quadrature component signal;

a third in-phase/quadrature component separating circuit for separating the digital signal outputted from said A/D converter into an in-phase component signal and a quadrature component signal; and an interference wave suppression control circuit for controlling the reference voltage of said A/D converter based on each signal separated by said second and third in-phase/quadrature component separating circuits, so that a gain difference of each digital signal outputted from said A/D converter or said delay circuit is equal to or less than a prescribed value.

9. The radio communication apparatus according to claim 8, wherein said A/D converter includes a fourth adder for generating said reference voltage by adding a prescribed voltage of which the voltage level is constant and the output voltage of said interference wave suppression control circuit, a voltage dividing circuit for outputting a plurality of voltages which are generated by dividing said reference voltage at a prescribed ratio, a plurality of comparators for comparing an analog voltage with each voltage outputted from said voltage dividing circuit, and an encoder for converting said analog input signal into a digital signal based on the comparative result of each of said comparators.

10. The radio communication apparatus according to claim 1, wherein said A/D converter includes a reference voltage generating circuit for generating said reference voltage by using a difference between a voltage obtained by adding a prescribed voltage of which the voltage level is constant and the output voltage of said interference wave suppression control circuit, and a voltage obtained by adding an inverse voltage of said prescribed voltage and an inverse output voltage of said interference wave suppression control circuit, a voltage dividing circuit for outputting a plurality of voltages which are generated by dividing said reference voltage at prescribed ratio, a plurality of comparators for comparing an analog voltage with each voltage outputted from said voltage dividing circuit, and an encoder for converting said analog input signal into said digital signal based on the comparative result of each of said comparators.

* * * * *